(12) United States Patent
Janvier

(10) Patent No.: US 11,489,000 B2
(45) Date of Patent: Nov. 1, 2022

(54) METHOD FOR PRODUCING AN IMAGER

(71) Applicant: TRIXELL, Moirans (FR)

(72) Inventor: Yannick Janvier, Moirans (FR)

(73) Assignee: TRIXELL, Moirans (FR)

( * ) Notice: Subject to any disclaimer, the term of this patent is extended or adjusted under 35 U.S.C. 154(b) by 3 days.

(21) Appl. No.: 17/362,719

(22) Filed: Jun. 29, 2021

(65) Prior Publication Data

US 2022/0013553 A1 Jan. 13, 2022

(30) Foreign Application Priority Data

Jul. 9, 2020 (FR) ...................................... 2007307

(51) Int. Cl.
*H01L 27/146* (2006.01)
*G01T 1/24* (2006.01)

(52) U.S. Cl.
CPC ............ *H01L 27/1469* (2013.01); *G01T 1/24* (2013.01); *H01L 27/14661* (2013.01); *H01L 27/14698* (2013.01)

(58) Field of Classification Search
CPC ........... H01L 27/1469; H01L 27/14661; H01L 27/14698; H01L 27/14683; H01L 27/14636; H01L 27/14603; H01L 27/14812; H01L 27/14634; H01L 27/14658; G01T 1/24; G01T 1/20182
See application file for complete search history.

(56) References Cited

U.S. PATENT DOCUMENTS

| 8,420,433 B2 * | 4/2013 | Jackson .............. H01L 27/1469 257/443 |
| 9,117,721 B1 | 8/2015 | Godfrey et al. |
| 10,283,557 B2 * | 5/2019 | Jacob ................ H01L 27/14663 |
| 2010/0255629 A1 | 10/2010 | Spartiotis et al. |

FOREIGN PATENT DOCUMENTS

JP 2013-004715 A 1/2013

* cited by examiner

*Primary Examiner* — Seung C Sohn
(74) *Attorney, Agent, or Firm* — BakerHostetler

(57) ABSTRACT

A method for producing an imager includes the following steps: a. attaching an imaging sensor to a first substrate; b. cutting out the first substrate a predefined distance around the attached imaging sensor; c. attaching a driver circuit board for driving the imaging sensor to the cut-out first substrate, close to the attached imaging sensor; d. connecting the driver circuit board for driving the imaging sensor to the attached imaging sensor in order to obtain a first tile; e. repeating the attaching, cutting-out, attaching, and connecting steps in order to obtain a second tile; f. butting together the obtained first tile and second tile by placing the cut-out first substrates in edge-to-edge contact; g. attaching the butted-together tiles to a main substrate; h. connecting the driver circuit boards of the imaging sensors of the butted-together first tile and second tile to a motherboard of the imager.

8 Claims, 3 Drawing Sheets

METHOD FOR PRODUCING AN IMAGER

CROSS-REFERENCE TO RELATED APPLICATIONS

This application claims priority to foreign French patent application No. FR 2007307, filed on Jul. 9, 2020, the disclosure of which is incorporated by reference in its entirety.

FIELD OF THE INVENTION

The technical field of the invention is that of producing imagers consisting of butted-together CCD or CMOS imaging sensors. More particularly, the invention relates to the butting together of photosensitive plates for digital sensors, for example for x-ray medical imaging using CMOS (complementary metal-oxide-semiconductor) technology.

BACKGROUND

A photosensitive sensor is generally made from solid-state photosensitive elements that are arranged in a matrix array. The photosensitive elements are made from semiconductor materials, usually monocrystalline silicon for CCD or CMOS sensors, polycrystalline silicon or amorphous silicon. A photosensitive element comprises at least one photodiode, phototransistor or photoresistor. These elements are arranged on a substrate or integrated into said substrate, which is generally a carrier (also called a plate) made of glass, of plastic (polymer) or metal or of another, synthetic material (carbon, alloy, ceramic, etc.) or of silicon. A photosensitive plate is then obtained.

In the context of producing imagers for x-ray medical imaging, the operation of butting together photosensitive plates, i.e. connecting photosensitive plates using CCD or CMOS technology end-to-end, involves observing tight tolerances. Specifically, it is important both to limit losses from regions of pixels on the butting lines and to ensure the alignment of the pixels from the various butted-together sensors. Additionally, it is necessary to avoid any contact between the plates during the operation of butting together the photosensitive plates due to a risk of breakage, chipping, and/or electrostatic discharge.

To date, this operation of butting together photosensitive plates has been performed using industrial means that are complex, expensive and have lengthy cycle times in order to ensure alignment tolerances and remove the risk of inter-plate collision.

In addition, the complex industrial means of the prior art have the limitation of being dedicated to a single plate size. They are based on means for gripping plates with predefined dimensions and alignment is achieved by means of cameras for alignment according to a spacing associated with the single plate size.

Another problem with the current solutions relates to testing the conformity of the obtained product. Specifically, this testing of the conformity of the product obtained after this lengthy and complex operation can only be carried out after completion of the butting-together and wire-bonding operations. In other words, if a non-conformity is detected in the method of the prior art, this can only be so on the finished product. The product is discarded. This entails a loss of materials used and a loss of time.

Stated otherwise, the known existing solutions for butting together photosensitive plates do not provide a solution that is fast, inexpensive, flexible and easily testable during the butting process.

SUMMARY OF THE INVENTION

The invention aims to overcome all or some of the problems mentioned above by providing a method for butting together photosensitive plates that allows the production of individually testable connected subelements, thereby substantially decreasing the risk of detecting non-conformity on the finished product. In addition, the method that is the subject of the invention facilitates the alignment of the subelements. It also provides a great deal of flexibility with regard to the dimensions of the obtained sensors without substantial investments or long and complex development. Other advantages of the method according to the invention are described in detail below.

To that end, one subject of the invention is a method for producing an imager comprising the following steps:
  a first step of attaching an imaging sensor to a first substrate;
  a second step of cutting out the first substrate a predefined distance around the attached imaging sensor;
  a third step of attaching a driver circuit board for driving the imaging sensor to the cut-out first substrate, close to the attached imaging sensor;
  a fourth step of connecting the driver circuit board for driving the imaging sensor to the attached imaging sensor in order to obtain a first tile;
  repeating the first, second, third and fourth steps in order to obtain a second tile;
  a fifth step of butting together the obtained first tile and second tile by placing the cut-out first substrates in edge-to-edge contact;
  a sixth step of attaching the butted-together tiles to a main substrate;
  a seventh step of connecting the driver circuit boards of the imaging sensors of the butted-together first tile and second tile to a motherboard of the imager.

Advantageously, the method for producing an imager according to the invention comprises, after the fourth step of connecting the driver circuit board for driving the imaging sensor to the bonded imaging sensor, a step of testing the conformity of the tile.

Advantageously, the method for producing an imager according to the invention comprises, after the fourth step of connecting the driver circuit board for driving the imaging sensor to the bonded imaging sensor, a step of storing the tile.

Advantageously, in the method for producing an imager according to the invention, the second step of cutting out the first substrate is a step of cutting by means of laser beam or of Bessel beams.

Advantageously, the method for producing an imager according to the invention comprises, after the first attaching step, a step of marking the first substrate.

In the method for producing an imager according to the invention, the first tile has dimensions that differ from the dimensions of the second tile.

The invention also relates to an imager comprising a first tile and a second tile, each of the tiles comprising:
  a first substrate,
  an imaging sensor attached to the first substrate, the first substrate being cut out a predefined distance around the bonded imaging sensor, a driver circuit board for driving the imaging sensor attached to the first substrate close to the imaging sensor and connected to the imaging sensor, the first tile and the second tile being butted together by placing the first substrates in edge-to-edge contact;

and the imager comprising a main substrate to which the butted-together tiles are attached, and a motherboard connected to the driver circuit boards for driving the imaging sensors of the butted-together first tile and second tile.

The first tile may have dimensions that differ from the dimensions of the second tile.

BRIEF DESCRIPTION OF THE DRAWINGS

The invention will be better understood and further advantages will become apparent from reading the detailed description of one embodiment provided by way of example, which description is illustrated by the attached drawing, in which.

For the sake of clarity, these figures are not all to the same scale. Moreover, the same elements will bear the same references in various figures.

DETAILED DESCRIPTION

Figure 1:
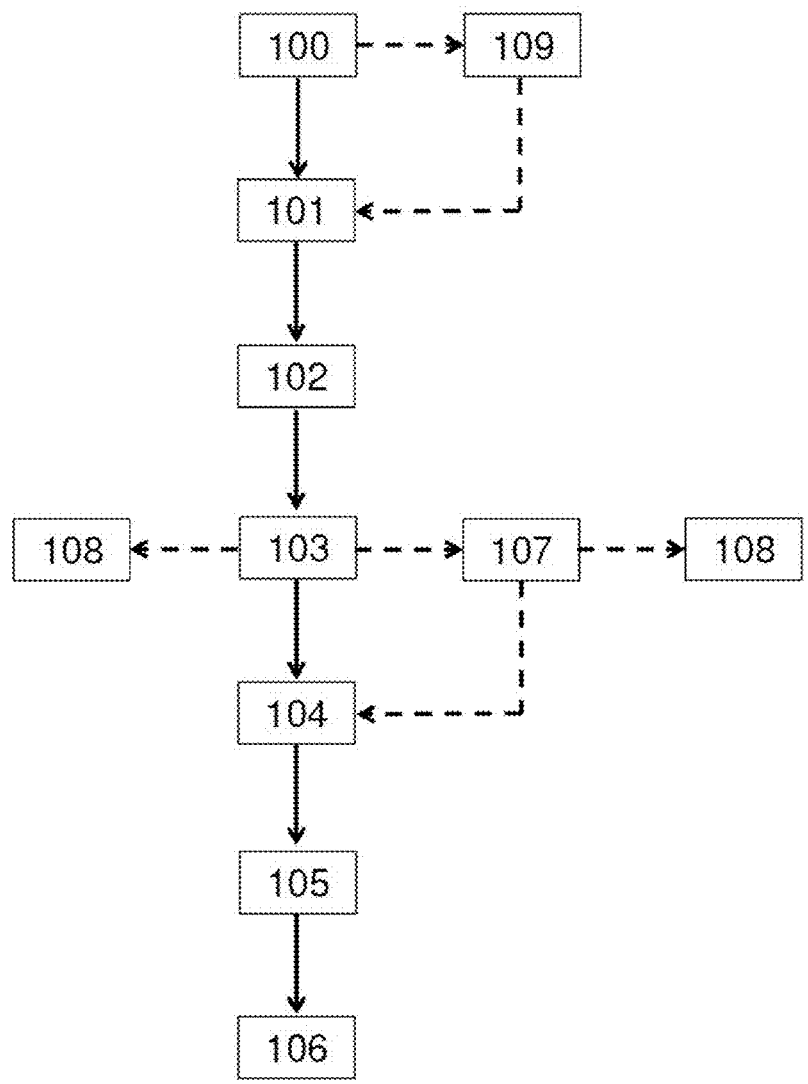
FIG. 1 shows a diagram of the steps of the method for producing an imager according to the invention.

FIG. 1 shows a diagram of the steps of the method for producing an imager according to the invention. The method for producing an imager comprises steps 100 to 106 which will be described in detail below. Optionally, it may comprise steps 107, 108, 109, taken individually or in combination.

Figure 2:
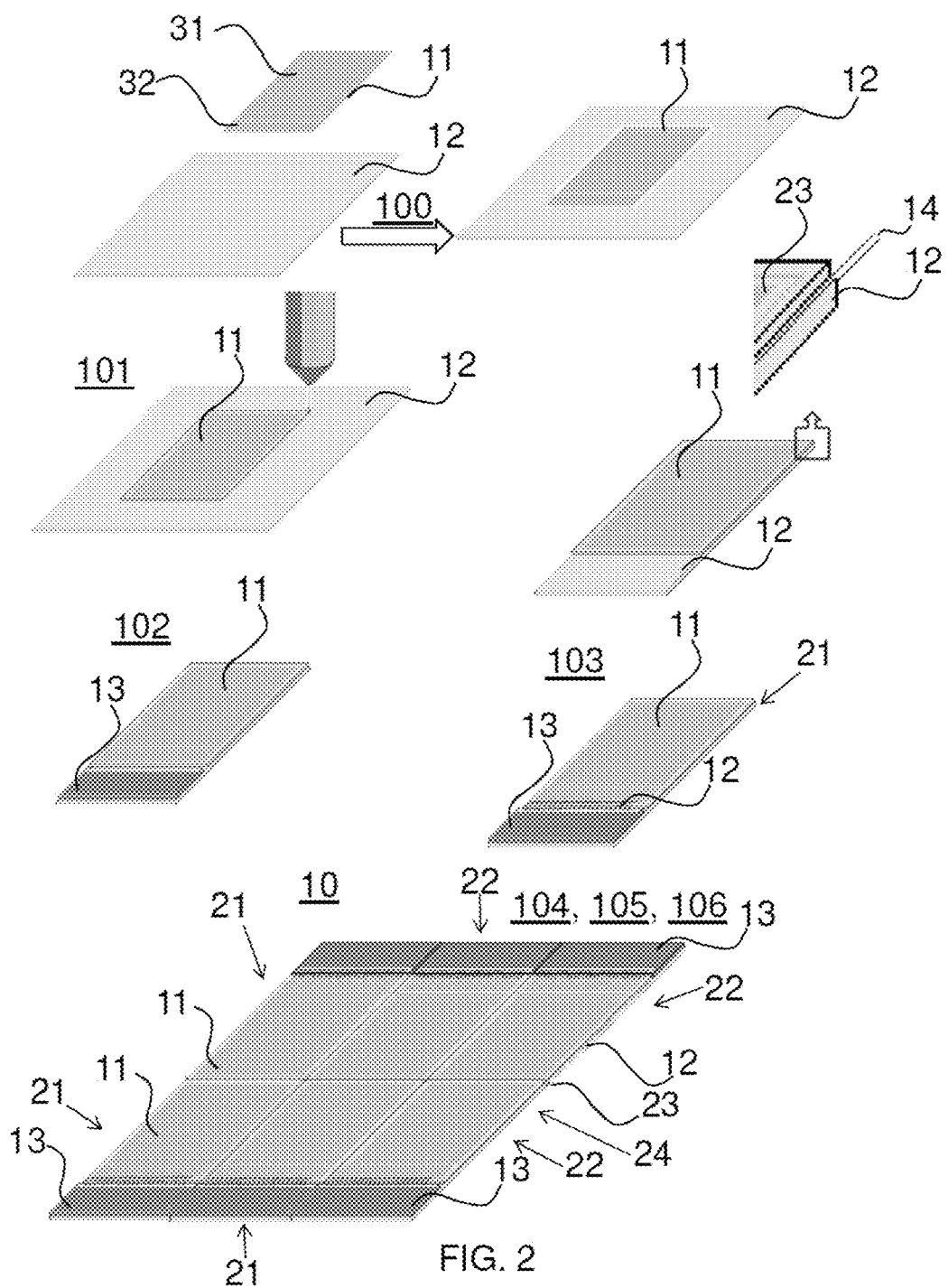
FIG. 2 schematically shows the main steps of the method for producing an imager according to the invention.

FIG. 2 schematically shows the main steps of the method for producing an imager according to the invention.

The method for producing an imager 10 comprises a first step 100 of attaching an imaging sensor 11 to a first substrate 12. The method according to the invention may be applied to an imaging sensor 11 using CMOS or CCD technology. The imaging sensor 11 is shown here with a rectangular shape, but it may take other polygonal shapes. The imaging sensor 11 comprises an imaging region 31 and a driving and connection region 32, which is intended to connect the imaging sensor 11 to a driver circuit board and to provide for the driving of the imaging sensor 11. The first substrate 12 may be made of glass, of ceramic or of crystalline material suitable for supporting an imaging sensor 11. Step 100 of attaching the imaging sensor 11 to the first substrate 12 is generally performed by bonding. Such bonding is advantageously achieved by applying a double-sided adhesive film to the first substrate 12. Alternatively, an adhesive may be deposited on the substrate 12. While bonding by means of adhesive film remains the preferred attachment method, other methods for attaching the imaging sensor 11 to the first substrate 12 may be implemented.

The bonding of individual imaging sensors 11 to the first substrate 12 thus takes place without tight alignment constraints. Alignment is within a few millimetres instead of within a few microns as would have been required by a method of the prior art.

The method according to the invention next comprises a second step 101 of cutting out the first substrate 12 a predefined distance 14 around the bonded imaging sensor 11. It is cut out all the way around the imaging sensor while leaving a small sill along the imaging region 31, and a larger space along an edge of the driving and the connection region 32 of the imaging sensor 11. This second space is intended to receive a driver circuit board for driving the imaging sensor 11. Since the imaging sensor 11 is bonded to the first substrate 12, it is the first substrate 12 which is cut out. This cutting has to be precise (of the order of 5 µm) and may be carried out using conventional equipment, for example cutting by means of laser beam or of Bessel beams. Bessel beams are a form of laser beam constructed by interference over a long distance, allowing an intense concentration of energy which may be prolonged without diffraction inside transparent materials. Bessel beams generated using an ultrafast laser allow depth ablation of the material under exposure, which is particularly suited to cutting high-aspect-ratio nanochannels. It is therefore possible to cut channels of very small diameter (less than 2 µm) into layers of glass several millimetres thick. After cutting nanochannels into the first substrate, it may be cut out along a line defined by the nanochannels. This technique allows good control of cutting, in order to provide the quality and precision of machining required to precisely machine glass on an industrial scale.

The cutting-out step may be performed from the front face or from the back face of the first substrate 12. Cutting out from the back face remains the favoured solution in order to avoid potential spatter on the imaging sensor 11. It is also possible to perform the cutting-out step using blades, but it is nevertheless important to ensure cutting precision and to make sure not to allow contaminants onto the imaging sensor so as not to damage it.

The cutting-out step provides another advantage in terms of mechanical and electrical (ESD) protection for the subassemblies of the imaging sensor 11 which is attached to the first substrate 12. Specifically, the first substrate 12 is cut out beyond the dimensions of the imaging sensors 11, removing the risk of lateral contact between imaging sensors 11 during later handling.

FIG. 2 shows an enlarged view of the first substrate 12 after cutting-out step 101 which leaves a small sill all the way around the imaging region 31 of the imaging sensor 11, at a distance 14 from the imaging sensor 11.

The method according to the invention further comprises a third step 102 of attaching a driver circuit board 13 for driving the imaging sensor 11 to the cut-out first substrate 12, close to the attached imaging sensor 11. More specifically, the driver circuit board 13 is attached to the first substrate 12 so as to juxtapose the driving and connection region 32 of the imaging sensor 11. In particular, the driver circuit board 13 may be attached by bonding, by means of an adhesive film or using adhesive.

Next, the method according to the invention comprises a fourth step 103 of connecting the driver circuit board 13 for driving the imaging sensor 11 to the attached imaging sensor 11 in order to obtain a first tile 21. The driver circuit board 13 is connected to the driving and connection region 32 of the imaging sensor 11. Connecting step 103 may be performed by wire bonding. Wire bonding is one of the techniques used to make the electrical connections between the imaging sensor 11 and the driver circuit board 13. Wiring is achieved using a wire soldered between the two connection pads provided for this purpose on each of the elements to be connected. The soldering is generally performed by ultrasound. The material of the wire is aluminium, gold or copper. The diameter of the wire is of the order of 20 µm. Steps 100 to 103 are performed successively for a tile. A plurality of steps 100 to 103 may be performed in parallel, i.e. at the same time, in order to obtain a plurality of tiles.

To obtain a second tile 22, the first, second, third and fourth steps are repeated. There are then two tiles 21, 22, each on its first substrate 12. In other words, there is the same number of first substrates 12 and tiles. The method is explained here using two tiles, but the principle applies in the same way to any number of tiles. Six tiles can be seen on the imager of FIG. 2, and the method is particularly advantageously applicable for an imager of very large size implementing a greater number of tiles.

The method according to the invention comprises a fifth step 104 of butting together the obtained first tile 21 and second tile 22 by placing the two cut-out first substrates 12 in edge-to-edge contact. Butting together means the action of joining end-to-end. The tile 21 is juxtaposed with the tile 22. In other words, the first substrate 11, after cutting-out step 101, displays a lateral surface that is substantially perpendicular to the plane of the imaging sensor 11. Each tile therefore has three free lateral surfaces, around the imaging region 31. Two tiles are butted together by placing a free lateral surface of one tile in contact with a lateral surface of another tile. By butting the tiles together in twos, it is possible to obtain a very large area of imaging sensors 11.

Once the tiles have been butted together, the position of each one is fixed. The method then comprises a sixth step 105 of attaching the butted-together tiles 21, 22 to a main substrate 23. The main substrate 23 goes onto the back face of the tiles, which helps to strengthen the imager.

Lastly, the method according to the invention comprises a seventh step 106 of connecting the driver circuit boards 13 of the imaging sensors 11 of the butted-together first tile 21 and second tile 22 to a motherboard 24 of the imager 10. Steps 104 to 106 are performed successively. They may be performed in parallel, i.e. at the same time, for a plurality of groups of tiles.

In one embodiment of the invention, the method for producing an imager may comprise, after the fourth step 103 of connecting the driver circuit board 13 for driving the imaging sensor 11 to the attached imaging sensor 11, a step 107 of testing the conformity of the tile.

The cutting out of the imaging sensors 11 carried out individually on the first substrate 12 and their connection to their driver circuit board 13 allow each tile to be isolated. Each tile may therefore be tested and characterized individually before storage, pairing and butting together of the tiles in order to produce the final imager.

Testing the individual tiles for conformity avoids the risk of discarding subassemblies with high added value because the conformity test occurs very early in the method for producing the imager and allows a potentially defective tile to be removed.

In one embodiment of the invention, the method for producing an imager may comprise, after the fourth step 103 of connecting the driver circuit board 13 for driving the imaging sensor 11 to the bonded imaging sensor 11, a step 108 of storing the tile.

Among other things, producing individual tiles addresses a need for secure storage. Since each imaging sensor 11 is bonded to its first substrate 12, there is little or no risk of breakage. It is also possible to effect traceability on reception of the imaging sensors on cutting film before the end date for the UV treatment. Specifically, by virtue of the method according to the invention, an imager may be produced in two stages: steps 100 to 103 are carried out to obtain an individual tile, and then the tile is stored. In a second stage, a plurality of stored, recently produced tiles may be butted together.

In one embodiment of the invention, the method for producing an imager may comprise, after the first attaching step 100, a step 109 of marking the first substrate 12. The marking may be carried out by tagging, affixing a barcode, or by etching a number or a code allowing the imaging sensor 11 to be traced. Once bonded to the first substrate 12, the first substrate 12 may be easily etched in order to link to the chip manufacturing data (batch number, characteristics of the image, etc.).

Lastly, it may be noted that the first tile 21 may have dimensions that differ from the dimensions of the second tile 22. This possibility of butting together tiles of different dimensions affords great flexibility in the type of imager that can be produced using the method according to the invention.

The invention provides a solution that uses standard equipment and methods in a novel and inventive manner to make it possible to produce imagers of large size. The invention avoids the risk of discarding high added value due to misalignment during conventional butting together (bonding all of the chips to a single substrate), breakage of the imaging sensor during the operation of butting a set of imaging sensors together on a single substrate, or damage to imaging sensors through electrostatic shock, which is only detectable during tests after assembling all of the imaging sensors.

The invention provides a solution that allows rapid cutting out of the "imaging sensor bonded to the first substrate" subassemblies, of the order of 200 to 300 mm/s, which means short cycle times. By virtue of producing individual tiles, the invention allows secure storage of tested and functional tiles.

Since each imaging sensor is bonded to a portion of first substrate, the invention allows good traceability of the imaging sensor on the first substrate of the tile.

Figure 3:
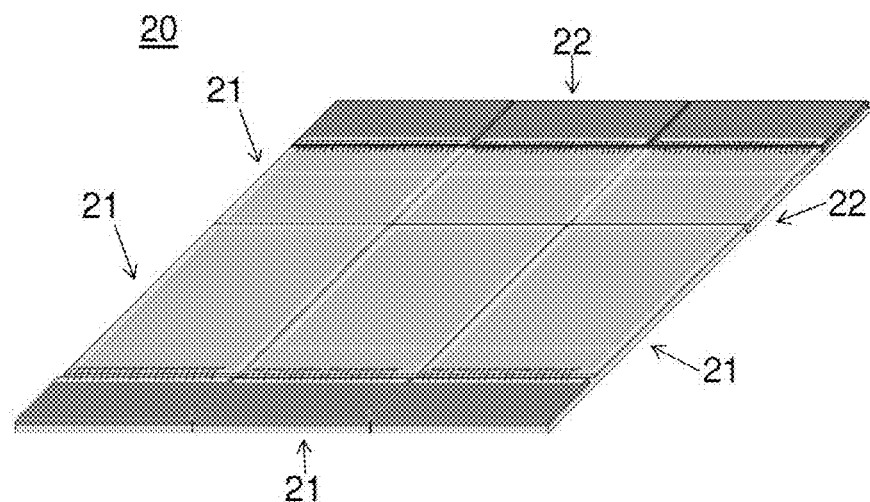
FIG. 3 schematically shows one embodiment of an imager according to the invention.

FIG. 3 schematically shows one embodiment of an imager according to the invention. The imager 20 comprises a first tile 21 and a second tile 22, each of the tiles 21, 22 comprises a first substrate 12, an imaging sensor 11 attached to the first substrate 12, the first substrate 12 being cut out a predefined distance 14 around the bonded imaging sensor 11, a driver circuit board 13 for driving the imaging sensor 11 attached to the first substrate 12 close to the imaging sensor 11 and connected to the imaging sensor 11. According to the invention, the first tile 21 and the second tile 22 are butted together by placing the two first substrates 12 in edge-to-edge contact. The imager 20 further comprises a main substrate 23 to which the butted-together tiles are attached, and a motherboard 24 connected to the driver circuit boards 13 for driving the imaging sensors 11 of the butted-together first tile 21 and second tile 22, in order to drive the plurality of driver circuit boards 13 of the imaging sensors 11. The imager 20 thus comprises a plurality of tiles and a plurality of first substrates 12 (each tile having its own first substrate). The tiles are butted together by placing the individual first substrates of the tiles in edge-to-edge contact. The tiles thus butted together are attached to a main substrate 23, distinct from the first substrates.

In the imager 20 shown in FIG. 3, the first tile 21 has dimensions that differ from the dimensions of the second tile 22. However, the invention also relates to an imager 10 in which all of the tiles have the same dimensions.

The invention applies to any image sensor produced by butting together photosensitive plates based on CMOS or another technology.

The invention claimed is:

1. A method for producing an imager, comprising the following steps:
   a. a first step of attaching an imaging sensor to a first substrate;
   b. a second step of cutting out the first substrate a predefined distance around the attached imaging sensor;
   c. a third step of attaching a driver circuit board for driving the imaging sensor to the cut-out first substrate, close to the attached imaging sensor;
   d. a fourth step of connecting the driver circuit board for driving the imaging sensor to the attached imaging sensor in order to obtain a first tile;
   e. repeating the first, second, third and fourth steps in order to obtain a second tile on its first substrate;
   f. a fifth step of butting together the obtained first tile and second tile by placing the two cut-out first substrates in edge-to-edge contact;
   g. a sixth step of attaching the butted-together tiles to a main substrate;
   h. a seventh step of connecting the driver circuit boards of the imaging sensors of the butted-together first tile and second tile to a motherboard of the imager.

2. The method for producing an imager according to claim 1, comprising, after the fourth step of connecting the driver circuit board for driving the imaging sensor to the bonded imaging sensor, a step of testing the conformity of the tile.

3. The method for producing an imager according to claim 1, comprising, after the fourth step of connecting the driver circuit board for driving the imaging sensor to the bonded imaging sensor, a step of storing the tile.

4. The method for producing an imager according to claim 1, wherein the second step of cutting out the first substrate is a step of cutting by means of laser beam or of Bessel beams.

5. The method for producing an imager according to claim 1, comprising, after the first attaching step, a step of marking the first substrate.

6. The method for producing an imager according to claim 1, wherein the first tile has dimensions that differ from the dimensions of the second tile.

7. An imager, comprising a first tile and a second tile, each of the tiles comprising:
   a. a first substrate,
   b. an imaging sensor attached to the first substrate, the first substrate being cut out a predefined distance around the bonded imaging sensor,
   c. a driver circuit board for driving the imaging sensor attached to the first substrate close to the imaging sensor and connected to the imaging sensor, the first tile and the second tile being butted together by placing the two first substrates in edge-to-edge contact;

and in that it comprises a main substrate to which the butted-together tiles are attached, and a motherboard connected to the driver circuit boards for driving the imaging sensors of the butted-together first tile and second tile.

8. The imager according to claim 7, wherein the first tile has dimensions that differ from the dimensions of the second tile.

* * * * *